United States Patent
Li et al.

(10) Patent No.: US 10,811,465 B2
(45) Date of Patent: Oct. 20, 2020

(54) DISPLAY PANEL WITH STEP-EDGE AND DISPLAY DEVICE

(71) Applicant: Shanghai Tianma AM-OLED Co., Ltd., Shanghai (CN)

(72) Inventors: Yuan Li, Shanghai (CN); Xian Chen, Shanghai (CN); Lijing Han, Shanghai (CN); Kaihong Huang, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 1 day.

(21) Appl. No.: 16/142,941

(22) Filed: Sep. 26, 2018

(65) Prior Publication Data
US 2020/0006444 A1 Jan. 2, 2020

(51) Int. Cl.
*H01L 27/32* (2006.01)

(52) U.S. Cl.
CPC ...... *H01L 27/3218* (2013.01); *H01L 27/3216* (2013.01)

(58) Field of Classification Search
CPC .......................... H01L 27/3218; H01L 27/3216
USPC .................... 257/40, 89, E51.022, E27.12
See application file for complete search history.

(56) References Cited

U.S. PATENT DOCUMENTS 10,078,486 B2 * 9/2018 Lee .................. G06F 3/1446
2010/0214195 A1 * 8/2010 Ogasawara ....... G02F 1/136286
345/55

FOREIGN PATENT DOCUMENTS

CN 106340251 A 1/2017

* cited by examiner

*Primary Examiner* — Robert T Huber
(74) *Attorney, Agent, or Firm* — Miller, Matthias & Hull LLP

(57) ABSTRACT

Provided are a display panel and a display device. The display panel includes a display region having a first steplike edge. The display region is provided with a plurality of sub-pixel groups. Each sub-pixel group includes a first sub-pixel unit, a second sub-pixel unit and a third sub-pixel unit. The first sub-pixel unit, the second sub-pixel unit and the third sub-pixel unit have different luminous colors. Along a connecting line of step apex angles of the first steplike edge, the display region is provided with a plurality of first sub-pixel groups and a plurality of second sub-pixel groups. The first sub-pixel unit in each first sub-pixel group is disposed at a step apex angle of the first steplike edge, and the second sub-pixel unit in each second sub-pixel group is disposed at the step apex angle of the first steplike edge.

4 Claims, 10 Drawing Sheets

DISPLAY PANEL WITH STEP-EDGE AND DISPLAY DEVICE

CROSS-REFERENCE TO RELATED APPLICATIONS

This application claims priority to a Chinese patent application No. 201810676867.7 filed on Jun. 27, 2018, the disclosure of which is incorporated herein by reference in its entirety.

TECHNICAL FIELD

The present disclosure relates to display technologies, and in particular relates to a display panel and a display device.

BACKGROUND

With the development of the Organic Light-Emitting Diode (OLED) display technology, OLED display technology has been increasingly widely used in wearable devices because OLED display panels have outstanding performance of a wide color gamut and a high contrast ratio, and the like.

In related arts, one of the display defects of OLED display panels is a color edge phenomenon which affects the screen display effect of display panels.

SUMMARY

The present disclosure provides a display panel and a display device to mitigate the color edge phenomenon of the display panel.

In a first aspect, an embodiment of the present disclosure provides a display panel. The display panel includes: a display region having a first steplike edge.

The display region is provided with a plurality of sub-pixel groups. Each of the plurality of sub-pixel groups includes a first sub-pixel unit, a second sub-pixel unit and a third sub-pixel unit. The first sub-pixel unit, the second sub-pixel unit and the third sub-pixel unit have different luminous colors.

Along a connecting line of step apex angles of the first steplike edge, the display region is provided with a plurality of first sub-pixel groups and a plurality of second sub-pixel groups. The first sub-pixel unit in each of the plurality of first sub-pixel groups is disposed at a step apex angle of the first steplike edge, and the second sub-pixel unit in each of the plurality of second sub-pixel groups is disposed at the step apex angle of the first steplike edge.

In a second aspect, an embodiment of the present disclosure further provides a display device. The display device includes the display panel described in any embodiments of the present disclosure.

In the embodiments of the present disclosure, the display region is provided with multiple first sub-pixel groups and multiple second sub-pixel groups along the connecting line of the step apex angles of the first steplike edge. So that multiple first sub-pixel units and multiple second sub-pixel units are disposed at the step apex angles of the first steplike edge, avoiding having only one type of sub-pixel units are disposed at the step apex angles of the first steplike edge, thereby effectively mitigating the color edge phenomenon of the display panel and improving the display effect of the display panel.

DETAILED DESCRIPTION

Figure 1:
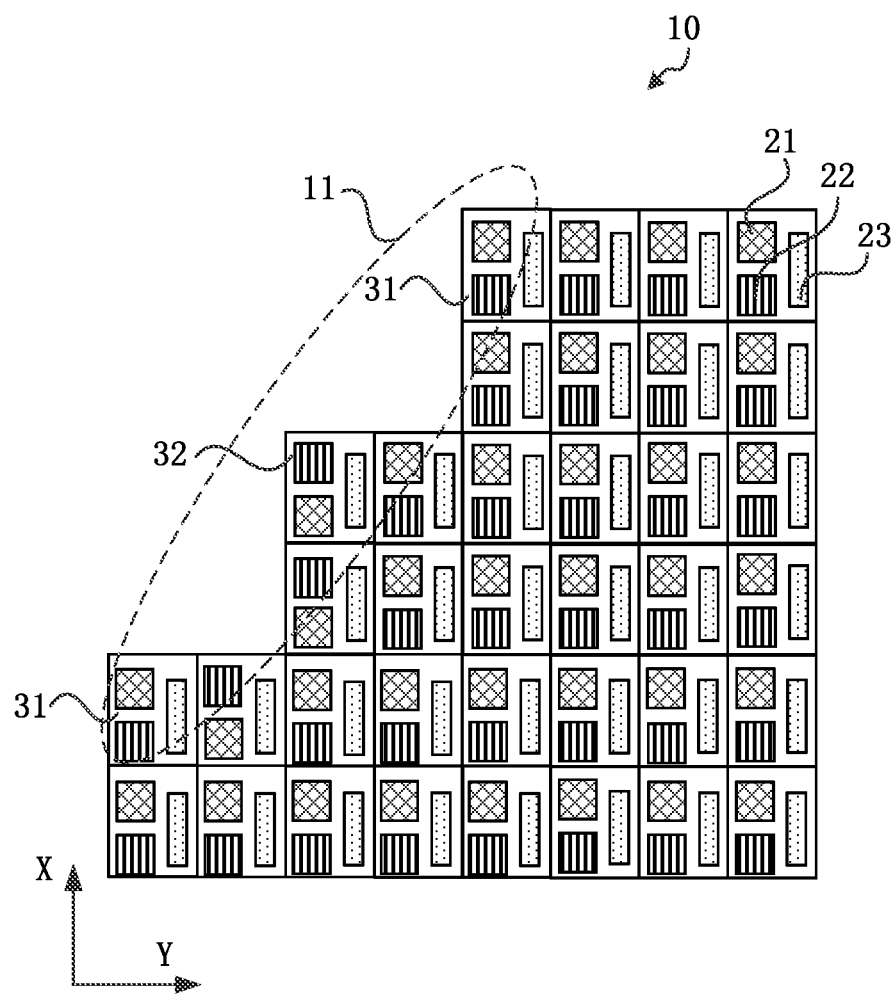
FIG. 1 is a partial schematic diagram of a display panel according to an embodiment of the present disclosure.

The present disclosure is further detailed below in combination with the drawings and embodiments. It should be understood that, the specific embodiments described herein are merely used to explain the present disclosure rather than limiting the present disclosure. In addition, it should be stated that in order to facilitate the description, merely a part of structures related to the present disclosure rather than the whole structure are illustrated in the drawings.

FIG. 1 is a partial schematic diagram of a display panel according to an embodiment of the present disclosure. This embodiment provides a display panel. Referring to FIG. 1, the display panel includes: a display region 10 having a first steplike edge 11.

The display region 10 is provided with a plurality of sub-pixel groups. Each of the plurality of sub-pixel groups include a first sub-pixel unit 21, a second sub-pixel unit 22 and a third sub-pixel unit 23. The first sub-pixel unit 21, the second sub-pixel unit 22 and the third sub-pixel unit 23 have different luminous colors.

Along a connecting line of step apex angles of the first steplike edge 11, the display region 10 is provided with a plurality of first sub-pixel groups 31 and a plurality of second sub-pixel groups 32. The first sub-pixel unit 21 in each of the plurality of first sub-pixel groups 31 is disposed at a step apex angle of the first steplike edge, and the second sub-pixel unit 22 in each of the plurality of second sub-pixel groups 32 is disposed at the step apex angle of the first steplike edge 11.

In one or more embodiments, display panels in related arts have only one type of pixel units disposed at the step apex angles of the steplike edge, that is, light of only one color is emitted from the apex angles of the steplike edge, causing the steplike edge to show this color during the display of the display panel. For example, the step apex angles are all provided with red sub-pixel units, the steplike edge casts red, that is, color edge phenomenon occurs. In this embodiment, the display region 10 provided with multiple first sub-pixel groups 31 and multiple second sub-pixel groups 32 along the connecting line of the step apex angles of the first steplike edge 11, so that multiple first sub-pixel units 21 and multiple second sub-pixel units 22 are disposed at the step apex angles of the first steplike edge, avoiding that only one type of sub-pixel units are disposed at the step apex angles of the first steplike edge, thereby effectively mitigating the color edge phenomenon the display panel and improving the display effect of the display panel.

In one or more embodiments, a secondary color of the luminous colors of the first sub-pixel unit 21 and the second sub-pixel unit 22 is yellow or white. Such an arrangement enables the secondary color of the luminous colors of the sub-pixel units along the step apex angles of the first steplike edge 11 to be white or yellow. Since human eyes are insensitive to yellow and white, the color edge phenomenon can be mitigated or even eliminated and the display effect of the display panel can be improved.

Additionally, it should be noted that the display region 10 is provided with multiple first sub-pixel groups 31 and multiple second sub-pixel groups 32 along the connecting line of the step apex angles of the first steplike edge 11, the distribution of the first sub-pixel groups 31 and the second sub-pixel groups 32 is not particularly limited in this embodiment, the first sub-pixel groups 31 and the second sub-pixel groups 32 may be evenly or unevenly distributed, and m second sub-pixel groups 32 may be disposed at intervals of n first sub-pixel groups 31, m and n are positive integers, and m may be equal or unequal to n, exemplarily, m=n=1, 2, 3, and the like.

In one or more embodiments, along the connecting line of the step apex angles of the first steplike edge 11, the first sub-pixel groups 31 and the second sub-pixel groups 32 are arranged in alternation. Through such arrangement, the plurality of first sub-pixel units 21 and plurality of the second sub-pixel units 22 are arranged in alternation at the step apex angles of the first steplike edge 11, so that the secondary color of the luminous colors in each position of the first steplike edge 11 is yellow or white, further mitigating the color edge phenomenon of the display panel and improving the display effect of the display panel.

In one or more embodiments, at each step of the first steplike edge 11, the sub-pixel units in adjacent sub-pixel groups may be distributed in a same mode. Exemplarily, referring to FIG. 1, an edge, which is along a first direction X, of each step is provided with only the plurality of first sub-pixel groups 31 or only the plurality of second sub-pixel groups 32, so that along the first direction X, the plurality of first sub-pixel groups 31 and the plurality of second sub-pixel groups 32 on a whole of the first steplike edge 11 are arranged in alternation, further mitigating the color edge phenomenon. FIG. 1 merely exemplarily shows that adjacent sub-pixel groups at the edge, which is along the first direction X, of each step are distributed in the same mode and is not intended to limit the present disclosure. In other embodiments, the adjacent sub-pixel groups at an edge, which is along a second direction Y, of each step may be distributed in the same mode.

Figure 2:
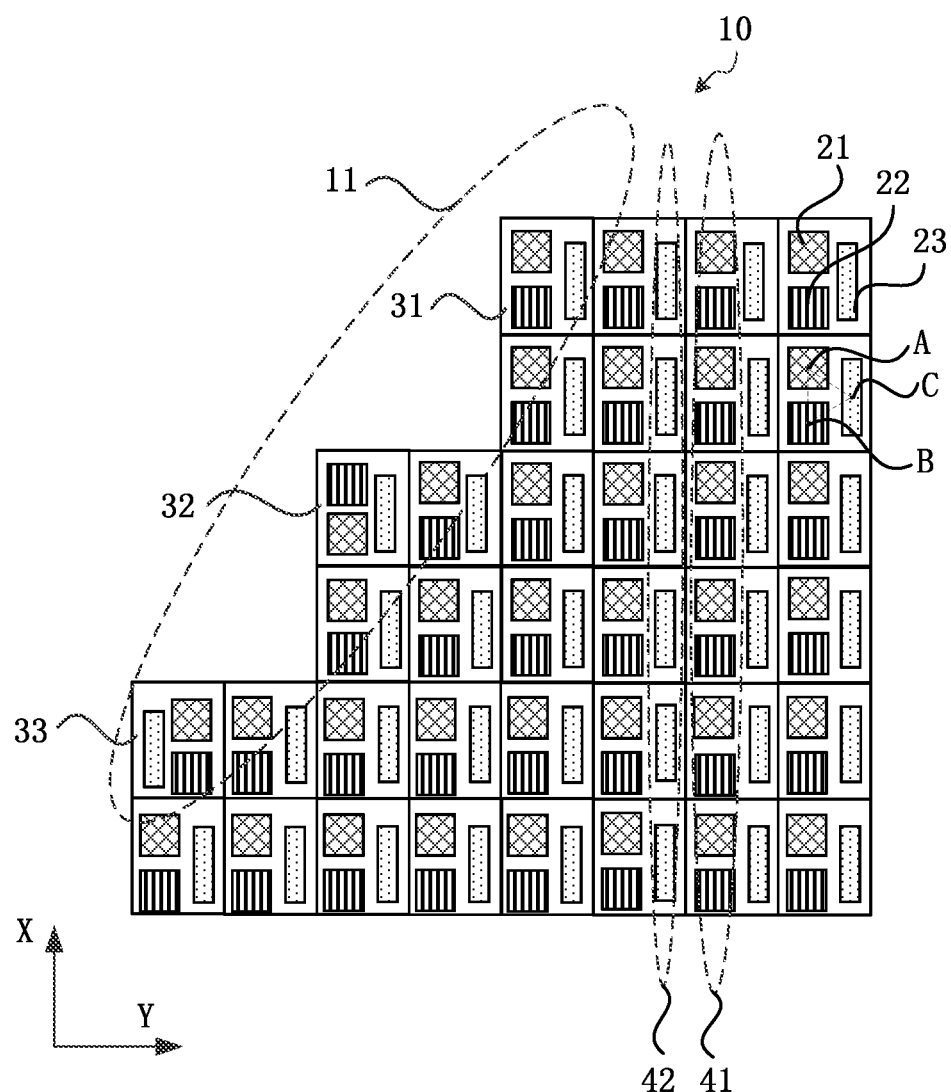
FIG. 2 is a partial schematic diagram of another display panel according to an embodiment of the present disclosure.

FIG. 2 is a partial schematic diagram of another display panel according to an embodiment of the present disclosure. In one or more embodiments, referring to FIG. 2, the display panel includes a plurality of third sub-pixel groups 33, and the third sub-pixel unit 23 in each of the plurality of third sub-pixel groups 33 is disposed at the step apex angle of the first steplike edge 11. Along the connecting line of the step apex angles of the first steplike edge, the plurality of first sub-pixel groups 31, the plurality of second sub-pixel groups 32 and the plurality of third sub-pixel groups 33 are arranged in alternation. A secondary color of luminous colors of the first sub-pixel unit 21, the second sub-pixel unit 22 and the third sub-pixel unit 23 is white.

Such an arrangement of the first sub-pixel units 21, the second sub-pixel units 22 and the third sub-pixel units 23 are arranged in alternation along the connecting line of step apex angles of the first steplike edge 11 enables that each position of the first steplike edge 11 emits white light, further mitigating the color edge phenomenon of the display panel and improving the display effect of the display panel.

In one or more embodiments, the first sub-pixel unit 21 is a red sub-pixel unit, the second sub-pixel unit 22 is a green sub-pixel unit and the third sub-pixel unit 23 is a blue sub-pixel unit.

It is to be noted that this embodiment merely exemplarily shows colors of the first sub-pixel unit, the second sub-pixel unit and the third sub-pixel unit and is not intended to limit the present disclosure. Additionally, the solution in this embodiment is applicable to various pixel arrangements. The following is illustrated with several typical pixel arrangements.

In one or more embodiments, referring to FIG. 2, in a non-edge region of the display region 10, a plurality of first sub-pixel columns 41 and a plurality of second sub-pixel columns 42 extend along a first direction X and are sequentially arranged in alternation along a second direction Y. In each of the plurality of first sub-pixel columns 41, a plurality of first sub-pixel units 21 and a plurality of second sub-pixel units 22 are sequentially arranged in alternation. In each of the plurality of second sub-pixel columns 42, a plurality of third sub-pixel units 23 are sequentially arranged. Along the first direction X, a geometric center C of each of the plurality of third sub-pixel units 23 is disposed between a geometric center A of the first sub-pixel unit 21 and a geometric center b of the second sub-pixel unit 22 adjacent to the each of the plurality of third sub-pixel units 23. The first direction X and the second direction Y intersect each other.

The first sub-pixel unit 21, the second sub-pixel unit 22 and the third sub-pixel unit 23 which are adjacent constitute a sub-pixel group.

In a region of the first steplike edge 11, a shape of each sub-pixel unit in the sub-pixel group is the same as a shape of a corresponding sub-pixel unit in the non-edge region, that is a shape of each first sub-pixel unit in a region of the first steplike edge is same as a shape of each first sub-pixel unit in the non-edge region, a shape of each second sub-pixel unit in the region of the first steplike edge is the same as a shape of each second sub-pixel unit in the non-edge region, and a shape of each third sub-pixel unit in the region of the first steplike edge is the same as a shape of each third sub-pixel unit in the non-edge region.

In one or more embodiments, a connecting line of a geometric center A of the first sub-pixel unit 21 and a geometric center B of the second sub-pixel unit 22 is AB, a connecting line of the geometric center A of the first sub-pixel unit 21 and the geometric center C of the third sub-pixel unit 23 is AC, a connecting line of the geometric center B of the second sub-pixel unit 22 and the geometric center C of the third sub-pixel unit 23 is BC, an included angle BAC between AB and AC is an acute angle, and an included angle ABC between AB and BC is an acute angle. The first sub-pixel unit 21 and the second sub-pixel unit 22 have the same or approximately same shape and size, for example, rectangles or approximate rectangles. Along the first direction X, the size of the third sub-pixel unit 23 is greater than both the size of the first sub-pixel unit 21 and the size of the second sub-pixel unit 22, and is less than a sum of the size of the first sub-pixel unit 21 and the size of the second sub-pixel unit 22. Comparing with the sub-pixel units in the plurality of sub-pixel groups in the non-edge region, the plurality of sub-pixel units in each of the plurality of sub-pixel groups in the region of the first steplike edge 11 have a different position, a same shape, and a same or different size. Referring to FIG. 2, at the step apex angles of the first steplike edge 11, the plurality of first sub-pixel units 21, the plurality of second sub-pixel units 22 and the plurality of third sub-pixel units 23 are arranged in alternation, effectively mitigating the color edge phenomenon.

Figure 3:
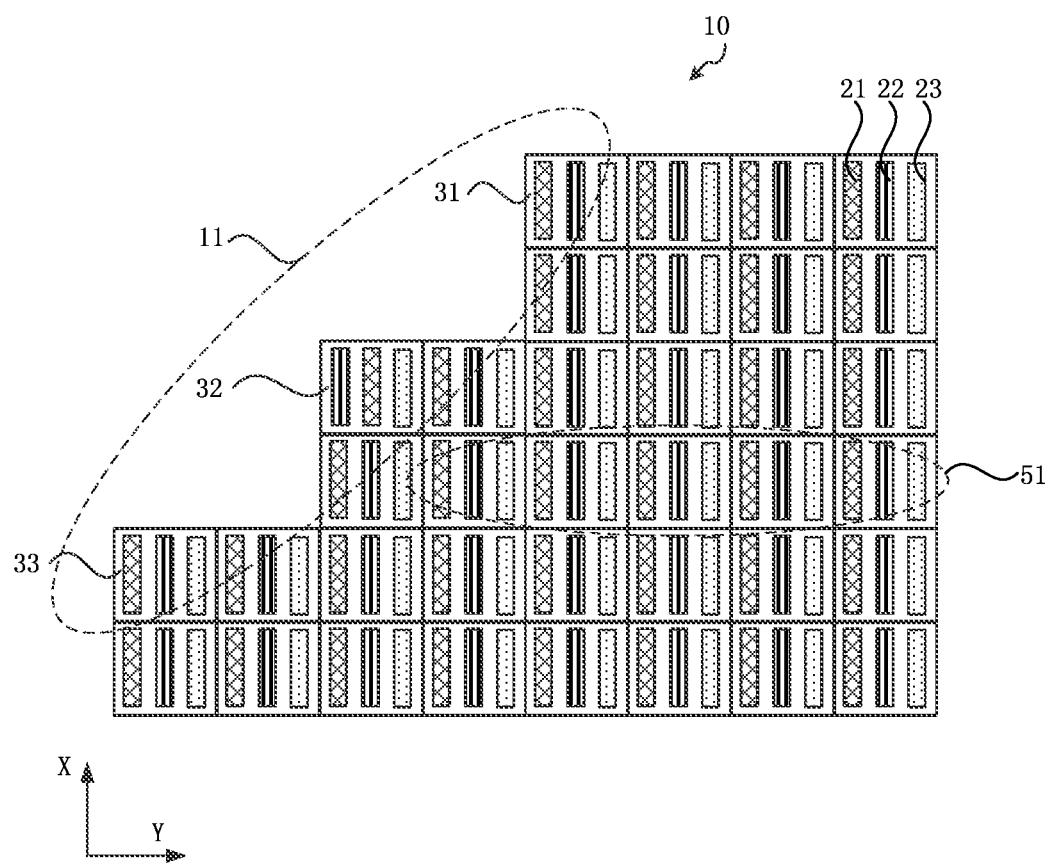
FIG. 3 is a partial schematic diagram of another display panel according to an embodiment of the present disclosure.

FIG. 3 is a partial schematic diagram of another display panel according to an embodiment of the present disclosure. Referring to FIG. 3, in a non-edge region of the display region, a plurality of sub-pixel rows 51 extend along the second direction Y and are sequentially arranged along a first direction X. In each of the plurality of sub-pixel rows 51, plurality of first sub-pixel units 21, a plurality of second sub-pixel units 22 and a plurality of third sub-pixel units 23 are sequentially arranged along the second direction Y. The first sub-pixel unit 21, the second sub-pixel unit 22 and the third sub-pixel unit 23 which are adjacent in the each of the plurality of the sub-pixel rows 51 constitute a sub-pixel group.

In a region of the first steplike edge 11, a shape of each sub-pixel unit of the sub-pixel group is the same as a shape of a corresponding sub-pixel unit of the non-edge region, that is a shape of each first sub-pixel unit in a region of the first steplike edge is the same as a shape of each first sub-pixel unit in the non-edge region, a shape of each second sub-pixel unit in the region of the first steplike edge is the same as a shape of each second sub-pixel unit in the non-edge region, and a shape of each third sub-pixel unit in the region of the first steplike edge is the same as a shape of each third sub-pixel unit in the non-edge region.

In one or more embodiments, in a pixel arrangement shown in FIG. 3, the first sub-pixel unit 21, the second sub-pixel unit 22 and the third sub-pixel unit 23 have the same or approximately same shape and size, for example, may all be rectangles. Referring to FIG. 3, at the step apex angles of the first steplike edge 11, the plurality of first sub-pixel units 21, the plurality of second sub-pixel units 22 and the plurality of third sub-pixel units 23 are arranged in alternation, effectively mitigating the color edge phenomenon.

Figure 4:
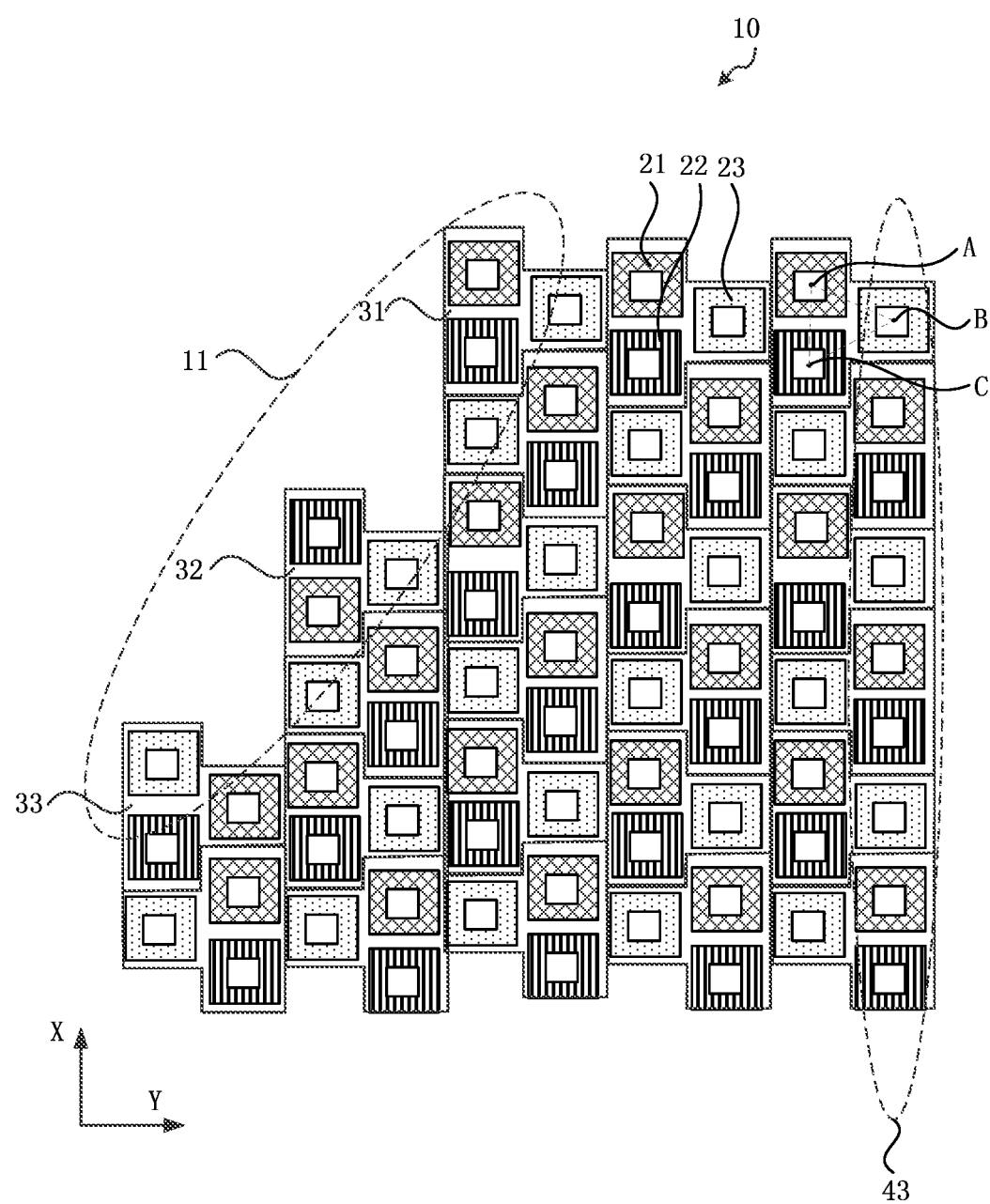
FIG. 4 is a partial schematic diagram of another display panel according to an embodiment of the present disclosure.

FIG. 4 is a partial schematic diagram of another display panel according to an embodiment of the present disclosure. Referring to FIG. 4, in a non-edge region of the display region, a plurality of third sub-pixel columns 43 extend along a first direction X and are arranged sequentially along a second direction Y. In each of the plurality of third sub-pixel columns 43, a plurality of first sub-pixel units 21, a plurality of second sub-pixel units 22 and a plurality of third sub-pixel units 23 are sequentially arranged. Along the first direction X, a geometric center of each sub-pixel unit is disposed between geometric centers of two sub-pixel units, in an adjacent sub-pixel columns, adjacent to the each sub-pixel unit, and the each sub-pixel unit and the two sub-pixel units, in an adjacent sub-pixel columns, adjacent to the each sub-pixel unit have different luminous colors. The first direction X and the second direction Y intersect each other.

In a region of the first steplike edge 11, a shape of each sub-pixel unit of a sub-pixel group is the same as a shape of a corresponding sub-pixel unit of the non-edge region, that is a shape of each first sub-pixel unit in a region of the first steplike edge is the same as a shape of each first sub-pixel unit in the non-edge region, a shape of each second sub-pixel unit in the region of the first steplike edge is the same as a shape of each second sub-pixel unit in the non-edge region, and a shape of each third sub-pixel unit in the region of the first steplike edge is the same as a shape of each third sub-pixel unit in the non-edge region.

In one or more embodiments, in a pixel arrangement shown in FIG. 4, the connecting line of a geometric center A of the first sub-pixel unit 21 and a geometric center B of the second sub-pixel unit 22 is AB, a connecting line of the geometric center A of the first sub-pixel unit 21 and the geometric center C of the third sub-pixel unit 23 is AC, the connecting line of the geometric center B of the second sub-pixel unit 22 and the geometric center C of the third sub-pixel unit 23 is BC, an included angle BAC between AB and AC is an acute angle, and an included angle ABC between AB and BC is an acute angle. The first sub-pixel unit 21, the second sub-pixel unit 22 and the third sub-pixel unit 23 have the same or approximately same shape and size, for example, may all be in the shape of a concentric square or a rectangle. Referring to FIG. 4, at the step apex angles of the first steplike edge 11, the plurality of first sub-pixel units 21, the plurality of second sub-pixel units 22 and the plurality of third sub-pixel units 23 are arranged in alternation, effectively mitigating the color edge phenomenon.

Figure 5:
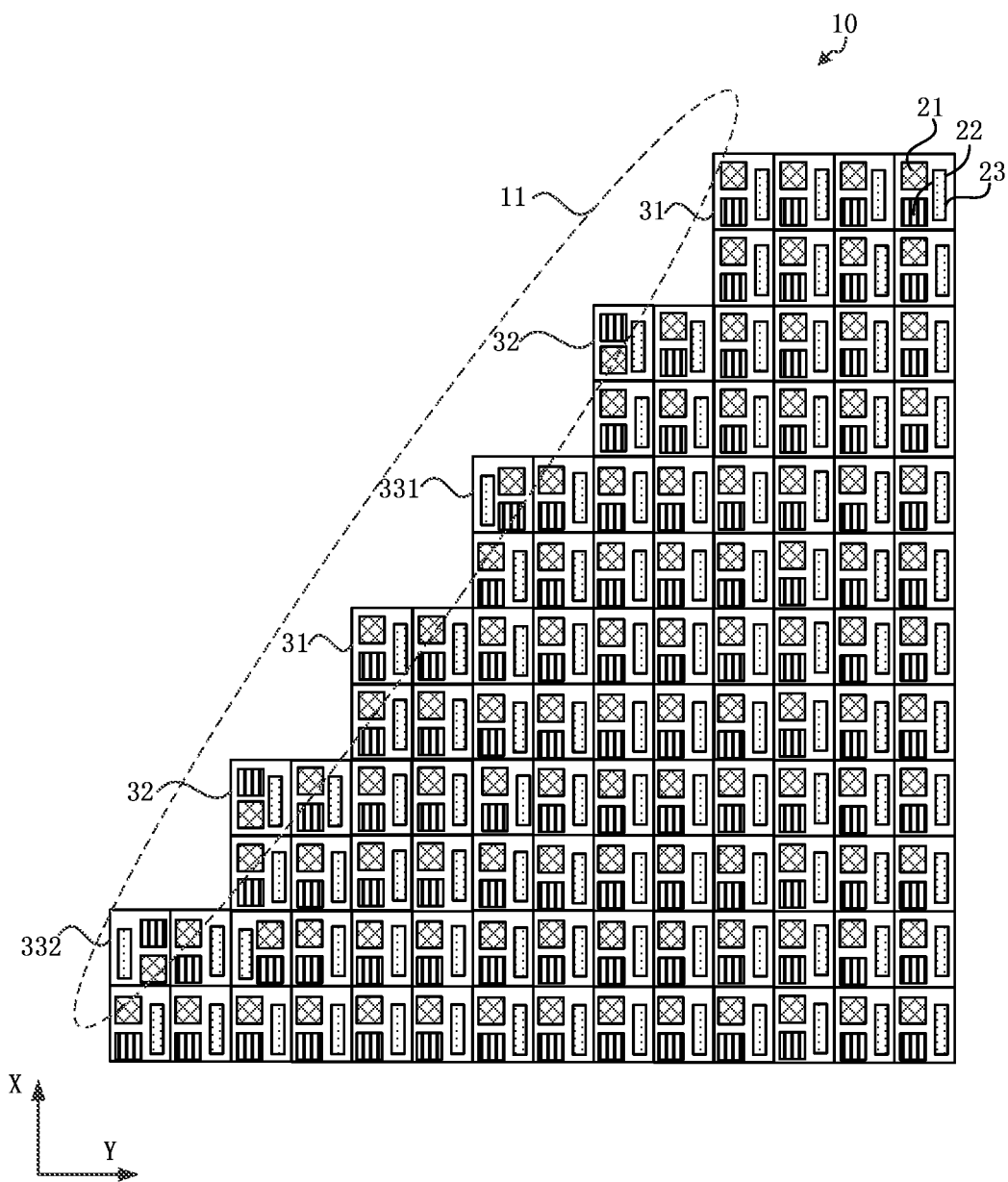
FIG. 5 is a partial schematic diagram of another display panel according to an embodiment of the present disclosure.

FIG. 5 is a partial schematic diagram of another display panel according to an embodiment of the present disclosure, referring to FIG. 5, the plurality of third sub-pixel groups 33 include first secondary sub-pixel groups 331 and second secondary sub-pixel groups 332. A position of the first sub-pixel unit 21 in each of the first secondary sub-pixel groups 331 is different from a position of the first sub-pixel unit 21 in each of the second secondary sub-pixel groups 332, and a position of the second sub-pixel unit 22 in each of the first secondary sub-pixel groups 331 is different from a position of the second sub-pixel unit 22 in each of the second secondary sub-pixel groups 332.

Along the connecting line of the step apex angles of the first steplike edge 11, the first secondary sub-pixel groups 331 and the second secondary sub-pixel groups 332 are arranged in alternation.

In one or more embodiments, referring to FIG. 5, in each of the plurality of first secondary sub-pixel groups 331, the first sub-pixel unit 21 is closer to the step apex angle than the second sub-pixel unit 22. In the plurality of second secondary sub-pixel groups 332, the second sub-pixel unit 22 is closer to the step apex angle than the first sub-pixel unit 21. The luminous colors of the sub-pixel units near the step apex angles may affect the luminous color of the steplike edge in the display region. Thus along the connecting line of the step apex angles of the first steplike edge 11, the first sub-pixel groups 31, the second sub-pixel groups 32 and the third sub-pixel groups 33 are arranged in alternation, and in the plurality of third sub-pixel groups 33, the first secondary sub-pixel groups 331 and the second secondary sub-pixel groups 332 are arranged in alternation. The display panel ensures that the first sub-pixel units 21, the second sub-pixel units 22 and the third sub-pixel units 23 at the step apex angles are arranged in alternation and that the first sub-pixel units 21 and the second sub-pixel units 22 near the step apex angles are arranged in alternation. This avoids that only one type of sub-pixel units are disposed near the step apex angles and affect the color at the edge of the display panel, further mitigating the color edge phenomenon and improving the display effect of the display panel.

Figure 6:
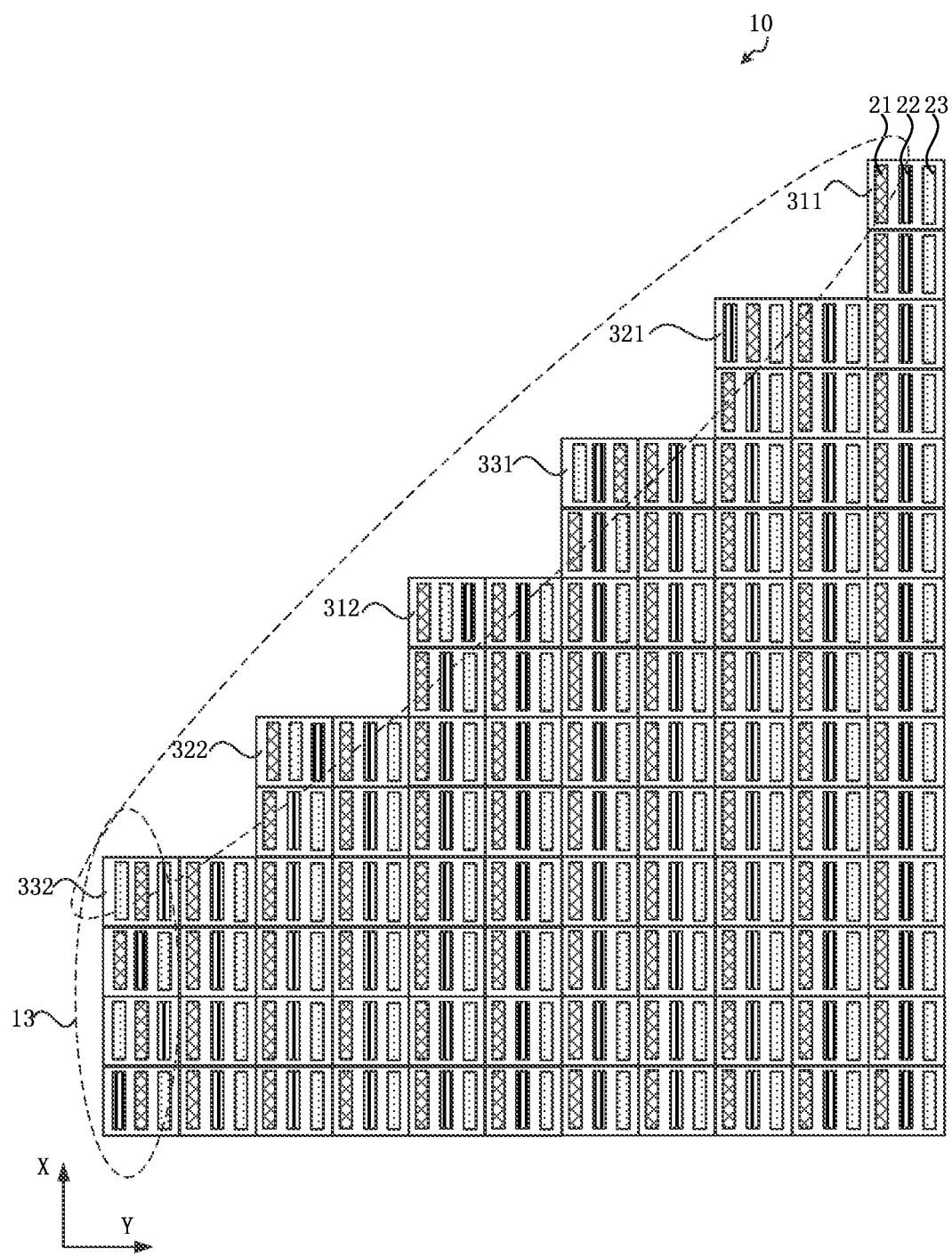
FIG. 6 is a partial schematic diagram of another display panel according to an embodiment of the present disclosure.

FIG. 6 is a partial schematic diagram of another display panel according to an embodiment of the present disclosure, referring to FIG. 6, the plurality of first sub-pixel groups 31 include a third secondary sub-pixel group 311 and a fourth secondary sub-pixel group 312. A position of the second sub-pixel unit 22 in each of the third secondary sub-pixel groups 311 is different from a position of the second sub-pixel unit 22 in each of the fourth secondary sub-pixel groups 312, and a position of the third sub-pixel unit 23 in each of the third secondary sub-pixel groups 311 is different from a position of the third sub-pixel unit 23 in each of the fourth secondary sub-pixel groups 312.

Along the connecting line of the step apex angles of the first steplike edge 11, the third secondary sub-pixel groups 311 and the fourth secondary sub-pixel groups 312 are arranged in alternation.

In one or more embodiments, referring to FIG. 6, in each third secondary sub-pixel group 311, the second sub-pixel unit 22 is closer to the step apex angles than the third sub-pixel unit 23. In each fourth secondary sub-pixel group 312, the third sub-pixel unit 23 is closer to the step apex angles than the second sub-pixel unit 22. Thus along the connecting line of the step apex angles of the first steplike edge 11, the plurality of first sub-pixel groups 31, the plurality of second sub-pixel groups 32 and the plurality of third sub-pixel groups 33 are arranged in alternation, and in the plurality of first sub-pixel groups 31, a plurality of third secondary sub-pixel groups 311 and a plurality of fourth secondary sub-pixel groups 312 are arranged in alternation. The display panel ensures that the first sub-pixel units 21, the second sub-pixel units 22 and the third sub-pixel units 23 at the step apex angles are arranged in alternation and that the second sub-pixel units 22 and the third sub-pixel units 23 near the step apex angles are arranged in alternation. This avoids that the step apex angles are provided with only one type of sub-pixel units are disposed near the step apex angles and affect color at the edge of the display panel, further mitigating the color edge phenomenon of the display panel and improving the display effect of the display panel.

In one or more embodiments, referring to FIG. 6, the plurality of second sub-pixel groups 32 include fifth secondary sub-pixel groups 321 and sixth secondary sub-pixel groups 322. A position of the first sub-pixel unit 21 in each of the fifth secondary sub-pixel groups 321 is different from a position of the first sub-pixel unit 21 in each of the sixth secondary sub-pixel groups 322, a position of the third sub-pixel unit 23 in each of the fifth secondary sub-pixel groups 321 is different from a position of the third sub-pixel unit 23 in each of the sixth secondary sub-pixel groups 322.

Along the connecting line of the step apex angles of the first steplike edge 11, the fifth secondary sub-pixel groups 321 and the sixth secondary sub-pixel groups 322 are arranged in alternation.

In one or more embodiments, referring to FIG. 6, in each of the plurality of fifth secondary sub-pixel groups 321 the first sub-pixel unit 21 is closer to the step apex angles than the third sub-pixel unit 23. In each of the plurality of sixth secondary sub-pixel groups 322, the third sub-pixel unit 23 is closer to the step apex angles than first sub-pixel unit 21. Thus along the connecting line of the step apex angles of the first steplike edge 11, the plurality of first sub-pixel groups 31, the plurality of second sub-pixel groups 32 and the plurality of third sub-pixel groups 33 are arranged in alternation, and in the second sub-pixel groups 32 the plurality of fifth secondary sub-pixel groups 321 and the plurality of sixth secondary sub-pixel groups 322 are arranged in alternation. The display panel ensures that the first sub-pixel units 21, the second sub-pixel units 22 and the third sub-pixel units 23 at the step apex angles are arranged in alternation and that the first sub-pixel units 21 and the third sub-pixel units 23 near the step apex angles are arranged in alternation. This avoids that only one type of sub-pixel units are disposed near the step apex angles and affect the color at the edge of the display panel, further mitigating the color edge phenomenon and improving the display effect of the display panel.

It is to be noted that FIG. 1 to FIG. 6 merely exemplarily show the position of the first steplike edge, that is, the step apex angles point to the top left of the display and not intend to limit the present disclosure. In other embodiments, the first steplike edge may be an edge in other position in the display region of the display panel, for example, a steplike edge where the step apex angles point to the bottom left, bottom right or top right of the display region. Additionally, an angle of the step apex angle may be 90 degrees, 45 degrees or 135 degrees, and the like, and is not particularly limited in the this embodiment.

Figure 7:
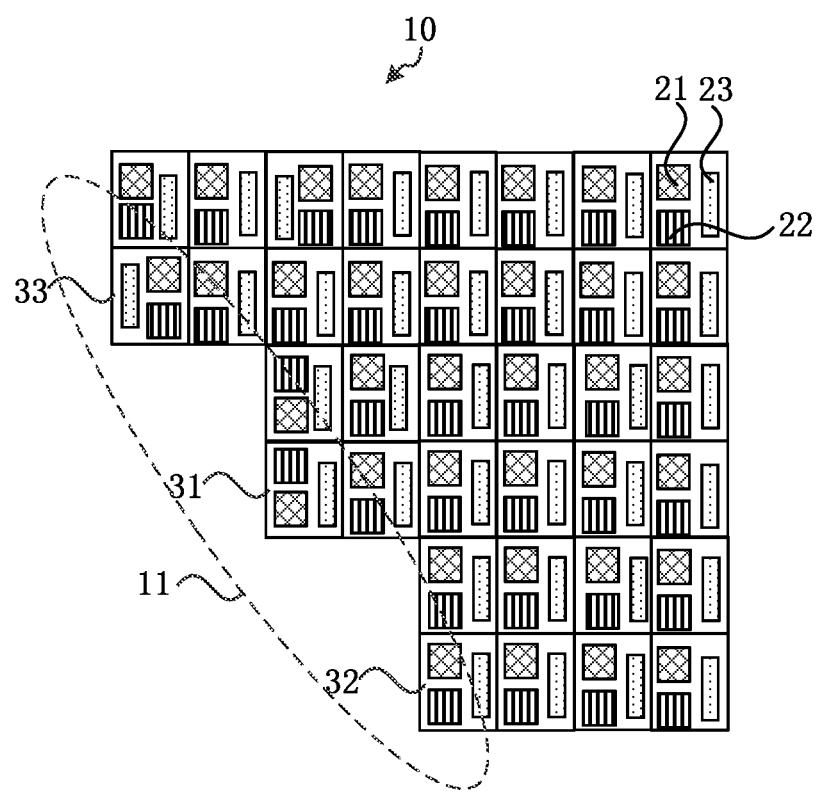
FIG. 7 is a partial schematic diagram of another display panel according to an embodiment of the present disclosure.

FIG. 7 is a partial schematic diagram of another display panel according to an embodiment of the present disclosure, referring to FIG. 7, the first steplike edge 11 may be a steplike edge where the step apex angles point to the bottom left of the display region 10. A plurality of first sub-pixel groups 31, a plurality of second sub-pixel groups 32 and a plurality of third sub-pixel groups 33 are arranged in alternation along the connecting line of the step apex angles of the first steplike edge 11, effectively mitigating the color edge phenomenon of the display panel.

Figure 8:
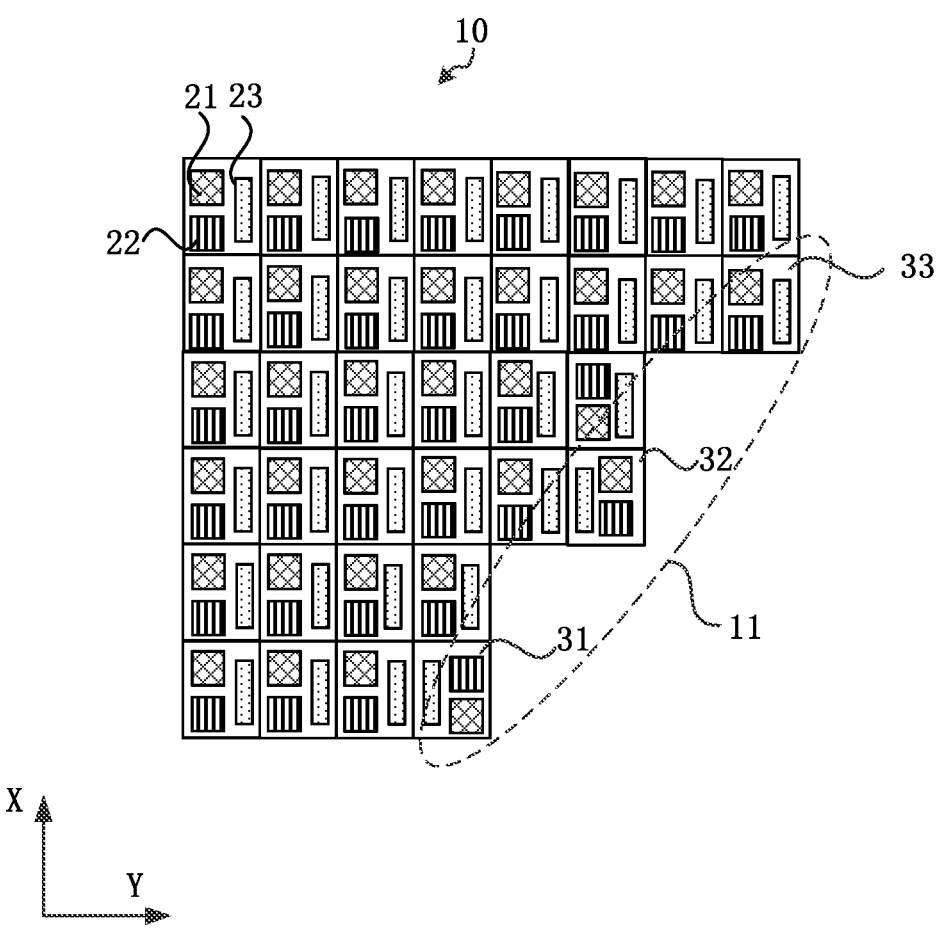
FIG. 8 is a partial schematic diagram of another display panel according to an embodiment of the present disclosure.

FIG. 8 is a partial schematic diagram of another display panel according to an embodiment of the present disclosure, referring to FIG. 8, the first steplike edge 11 may be a steplike edge where the step apex angles point to the bottom right of the display region 10. A plurality of first sub-pixel groups 31, a plurality of second sub-pixel groups 32 and a plurality of third sub-pixel groups 33 are arranged in alternation along the connecting line of the step apex angles of the first steplike edge 11, effectively mitigating the color edge phenomenon of the display panel.

Figure 9:
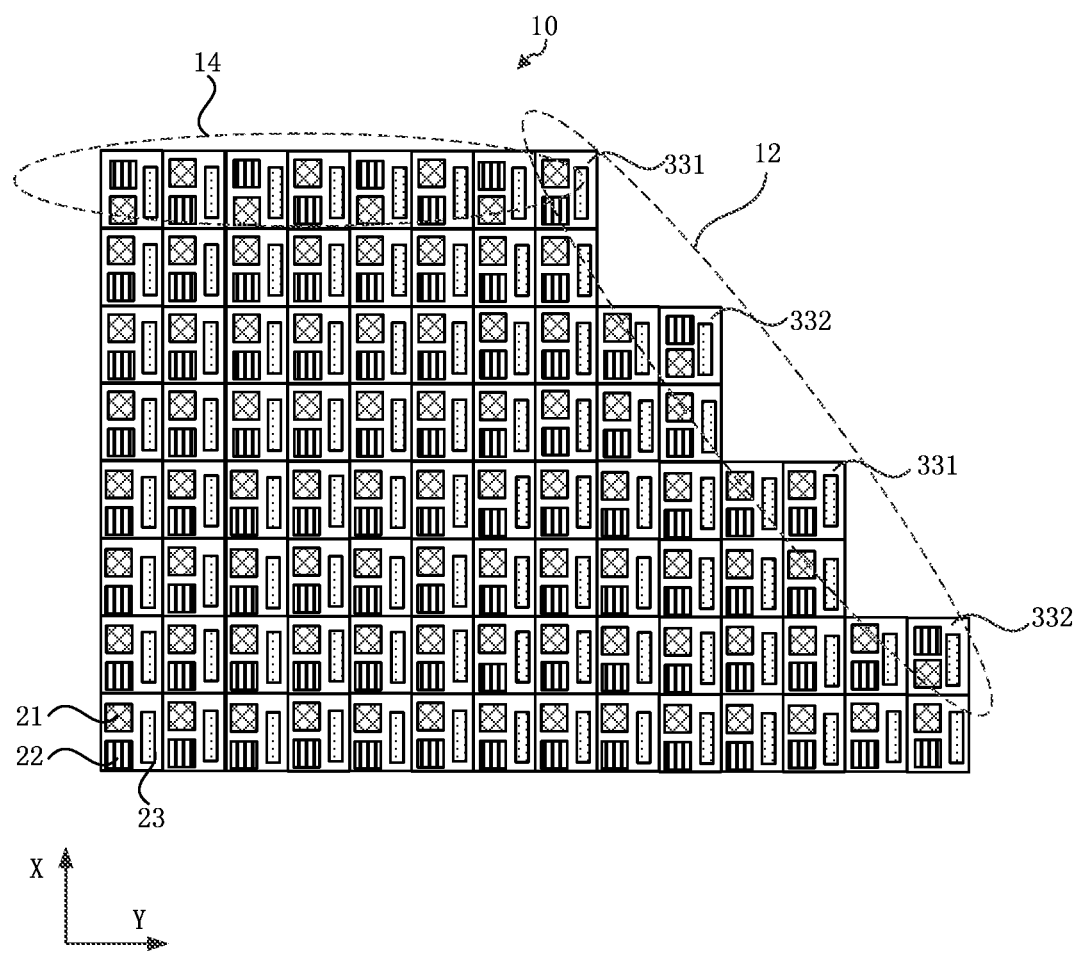
FIG. 9 is a partial schematic diagram of another display panel according to an embodiment of the present disclosure.

FIG. 9 is a partial schematic diagram of another display panel according to an embodiment of the present disclosure, referring to FIG. 9, the display region 10 further includes a second steplike edge 12. Along a connecting line of step apex angles of the second steplike edge 12, the first secondary sub-pixel groups 331 and the second secondary sub-pixel groups 332 are arranged in alternation.

In one or more embodiments, the luminous efficiency of the blue sub-pixel unit is lower than the luminous efficiency of the red sub-pixel unit and the luminous efficiency of the green sub-pixel unit, and when the blue sub-pixel unit is disposed at the step apex angle, the red sub-pixel unit near the step apex angle and the green sub-pixel unit near the step apex angle have greater impact on the light that the steplike edge shows. For example, when the red sub-pixel unit is closer to the step apex angle than the green sub-pixel unit, the steplike edge may show a purple color edge phenomenon, and when the green sub-pixel unit is closer to the step apex angle than the red sub-pixel unit, the steplike edge may show a cyan color edge phenomenon.

In this embodiment, the first secondary sub-pixel groups 331 and the second secondary sub-pixel groups 332 are arranged in alternation along the connecting line of the step apex angles of the second steplike edge 12, so that the second sub-pixel units 22 and the first sub-pixel units 21 are arranged in alternation near the step apex angles, and the red sub-pixel units, the green sub-pixel units and the blue sub-pixel units are distributed evenly, effectively mitigating the color edge phenomenon. In a pixel arrangement shown in FIG. 9, the shape of the third sub-pixel unit 23 is different from the shape of the first sub-pixel unit 21 and the shape of the second sub-pixel unit 22. In the technical solution of this embodiment, it is not needed to change the position of the third sub-pixel unit 23, which prevents the uneven shape distribution of the mask adopted by evaporation after the position of the third sub-pixel unit 23 is changed, so as to prevent the fabrication precision of the display panel from being affected by uneven force applied to the mask when the mask is fixed.

In one or more embodiments, referring to FIG. 6, the display region 10 further includes a first linear edge 13 extending along a first direction X. And along the first linear edge 13, at least part of sub-pixel units disposed on the first linear edge 13 and in adjacent sub-pixel groups have different luminous colors.

Such an arrangement prevents sub-pixel units that emit only one luminous color from being disposed at the first linear edge 13, effectively mitigating the color edge phenomenon at the first linear edge 13 and improving the display effect of the display panel. Take the pixel arrangement shown in FIG. 6 as an example, the phenomenon in which only red sub-pixel units are disposed on the first linear edge 13 can be prevented so that the red color edge phenomenon can be prevented. Along the first linear edge 13, red sub-pixel units and green sub-pixel units are arranged in alternation to make the first linear edge 13 yellowish, or red sub-pixel units, green sub-pixel units and blue sub-pixel units are arranged in alternation to make the first linear edge 13 white.

In one or more embodiments, referring to FIG. 9, the display region 10 further includes a second linear edge 14 extending along a second direction Y. And along the second linear edge 14, at least part of the sub-pixel units disposed on the second linear edge 14 and in adjacent sub-pixel groups have different luminous colors.

Such an arrangement can effectively mitigate the color edge phenomenon on the second linear edge 14 and further improve the display effect of the display panel. Take the pixel arrangement shown in FIG. 9 as an example, the red sub-pixel units, the green sub-pixel units and the blue sub-pixel units are arranged in alternation along the second linear edge 14 so that the second linear edge 14 shows white.

In one or more embodiments, the connecting line of the step apex angles of the first steplike edge is arc-shaped, and the connecting line of the step apex angles of the second steplike edge is arc-shaped. The display region may be a special-shaped display region which has an arc-shaped edge. Exemplarily, the shape of the display region may be a round rectangle or a circle. It is to be noted that the connecting line of the step apex angles may be arc-shaped or approximately arc-shaped. The shape of the step apex angles is not particularly limited in this embodiment.

In one or more embodiments, a size of each sub-pixel unit in a region of the first steplike edge is smaller than the size of a corresponding sub-pixel unit in a non-edge region. That is, a size of the first sub-pixel unit in a region of the first steplike edge is smaller than a size of the first sub-pixel unit in the non-edge region, a size of the second sub-pixel unit in a region of the first steplike edge is smaller than a size of the second sub-pixel unit in the non-edge region, a size of the third sub-pixel unit in a region of the first steplike edge is smaller than a size of the third sub-pixel unit in the non-edge region. Such arrangement can decrease the luminance in the edge region, mitigate the jagged edge effect and improve the display effect of the display panel.

Figure 10:
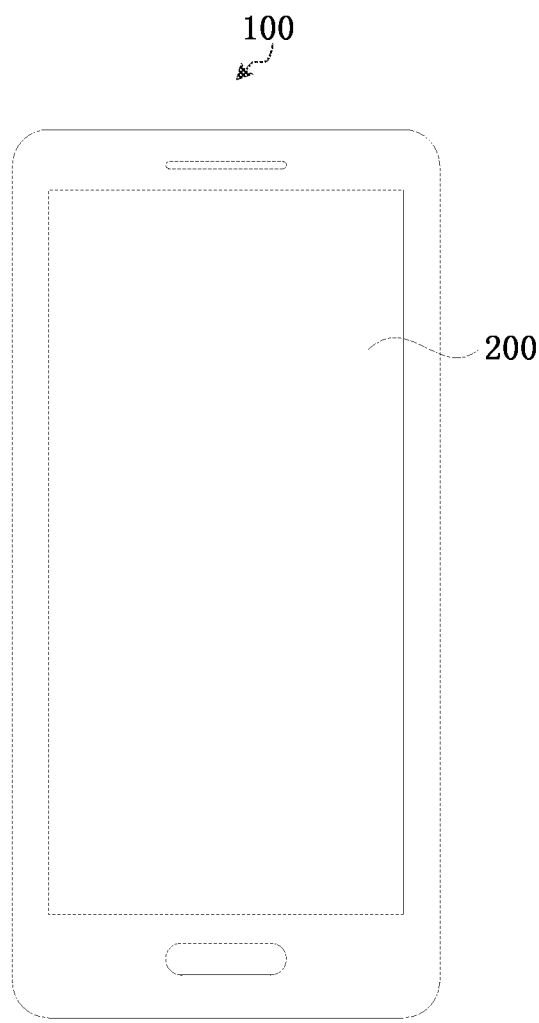
FIG. 10 is a schematic diagram of a display device according to an embodiment of the present disclosure.

FIG. 10 is a schematic diagram of a display device according to an embodiment of the present disclosure. Referring to FIG. 10, the display device 100 includes the display panel 200 provided by any of the embodiments of the present disclosure. The display device 100 may be a mobile phone, a tablet PC or other electronic device.

What is claimed is:

1. A display panel, comprising:
a display region having a first step-like edge, wherein the display region is provided with a plurality of sub-pixel groups, each of the plurality of sub-pixel groups comprises a first sub-pixel unit, a second sub-pixel unit and a third sub-pixel unit, and the first sub-pixel unit, the second sub-pixel unit and the third sub-pixel unit have different luminous colors; and along a connecting line of step apex angles of the first step-like edge, the display region is provided with a plurality of first sub-pixel groups and a plurality of second sub-pixel groups, wherein the first sub-pixel unit in each of the plurality of first sub-pixel groups is disposed at a step apex angle of the first step-like edge, and the second sub-pixel unit in each of the plurality of second sub-pixel groups is disposed at the step apex angle of the first step-like edge, wherein the display region is further provided with a plurality of third sub-pixel groups, wherein the third sub-pixel unit in each of the plurality of third sub-pixel groups is disposed at the step apex angle of the first step-like edge; and along the connecting line of the step apex angles of the first step-like edge, the plurality of first sub-pixel groups, the plurality of second sub-pixel groups and the plurality of third sub-pixel groups are arranged in alternation, wherein, a secondary color of luminous colors of the first sub: pixel unit, the second sub-pixel unit and the third sub-pixel unit is white, wherein a non-edge region of the display region, a plurality of first sub-pixel columns and a plurality of second sub-pixel columns extend along a first direction and are sequentially arranged in alternation along a second direction, wherein in each of the plurality of first sub-pixel columns, a plurality of first sub-pixel units and a plurality of second sub-pixel units are sequentially arranged in alternation, and in each of the plurality of second sub-pixel columns, a plurality of third sub-pixel units are sequentially arranged: along the first direction, a geometric center of each of the plurality of third sub-pixel units is disposed between geometric centers of the first sub-pixel unit and the second sub-pixel unit adjacent to the each of the plurality of third sub pixel units, wherein the first direction and the second direction intersect each other;

the first sub-pixel unit, the second sub-pixel unit and the third sub-pixel unit which are adjacent constitute a sub-pixel group; and a shape of each first sub-pixel unit in a region of the first step-like edge is same as a shape of each first sub-pixel unit in the non-edge region, a shape of each second sub-pixel unit in the region of the first step-like edge is same as a shape of each second sub-pixel unit in the non-edge region, a shape of each third sub-pixel unit in the region of the first step-like edge is same as a shape of each third sub-pixel unit in the non-edge region, wherein the plurality of third sub-pixel groups comprise first secondary sub-pixel groups and second secondary sub-pixel groups, and a position of the first sub-pixel unit in each of the first secondary sub-pixel groups is different from a position of the first sub-pixel unit in each of the second secondary sub-pixel groups, and a position of the second sub-pixel unit in each of the first secondary sub-pixel groups is different from a position of the second sub-pixel unit in each of the second secondary sub-pixel groups; and along the connecting line of the step apex angles of the first step-like edge, the first secondary sub-pixel groups and the second secondary sub-pixel groups are arranged in alternation.

2. The display panel according to claim 1, wherein along the connecting line of the step apex angles of the first step-like edge, the plurality of first sub-pixel groups and the plurality of second sub-pixel groups are arranged in alternation.

3. The display panel according to claim 1, wherein the first sub-pixel unit is a red sub-pixel unit, the second sub-pixel unit is a green sub-pixel unit and the third sub-pixel unit, is a blue sub-pixel unit.

4. A display device, comprising a display panel, wherein, the display panel comprises a display region having a first step-likes edge, wherein the display region is provided with a plurality of sub-pixel groups, each of the plurality of sub-pixel groups comprises a first sub-pixel unit, a second sub-pixel unit and a third sub-pixel unit, and the first sub-pixel unit, the second sub-pixel unit and the third sub-pixel unit have different luminous colors; and along a connecting line of step apex angles of the first step-like edge, the display region is provided with a plurality of first sub-pixel groups and a plurality of second sub-pixel groups, wherein the first sub-pixel unit in each of the plurality of first sub-pixel groups is disposed at a step apex angle of the first step-like edge, and the second sub-pixel unit in each of the plurality of second sub-pixel groups is disposed at the step apex angle of the first step-like edge, wherein the display region is further provided with a plurality of third sub-pixel groups, wherein the third sub-pixel unit in each of the plurality of third sub-pixel groups is disposed at the step apex angle of the first step-like edge; and along the connecting line of the step apex angles of the first step-like edge, the plurality of first sub-pixel groups, the plurality of second sub-pixel groups and the plurality of third sub-pixel groups are arranged in alternation, wherein, a secondary color of luminous colors of the first sub-pixel unit, the second sub-pixel unit and the third sub-pixel unit is white, wherein in a non-edge region of the display region, a plurality of first sub pixel columns and a plurality of second sub-pixel columns extend along a first direction and are sequentially arranged in alternation along a second direction, wherein in each of the plurality of first sub-pixel columns, a plurality of first sub-pixel units, and a plurality of second sub-pixel units are sequentially arranged in alternation, and in each of the plurality of second sub-pixel columns, a plurality of third sub-pixel units are sequentially arranged; along the first direction, a geometric center of each of the plurality of third sub-pixel units is disposed between geometric centers of the first sub-pixel unit and the second sub-pixel unit adjacent to the each of the plurality of third sub-pixel units, wherein the first direction and the second direction intersect each other;

the first sub-pixel unit, the second sub-pixel unit and the third sub-pixel unit which are adjacent constitute a sub-pixel group; and a shape of each first sub-pixel unit in a region of the first step like edge is same as a shape of each first sub-pixel unit in the non-edge region, a shape of each second sub-pixel unit in the region of the first step-like edge is same as a shape of each second sub-pixel unit in the non-edge region, a shape of each third sub-pixel unit in the region of the first step-like edge is same as a shape of each third sub-pixel unit in the non-edge region, wherein the plurality of third sub-pixel groups comprise first secondary, sub-pixel groups and second secondary sub-pixel groups, and a position of the first sub-pixel unit in each of the first secondary sub-pixel groups is different from a position of the first sub-pixel unit in each, of the second secondary sub-pixel groups and a position of the second sub-pixel unit in each of the first secondary sub-pixel groups is different from a position of the second sub-pixel unit in each of the second secondary sub-pixel groups; and along the connecting line of the step apex angles of the first step-like edge, the first secondary sub-pixel groups and the second secondary sub-pixel groups are arranged in alternation.

* * * * *